United States Patent
Wen et al.

(10) Patent No.: US 12,395,136 B2
(45) Date of Patent: Aug. 19, 2025

(54) HIGH-EFFICIENCY AMPLIFIER ARCHITECTURE WITH DE-GAIN STAGE

(71) Applicant: MEDIATEK INC., Hsin-Chu (TW)

(72) Inventors: Sung-Han Wen, Hsinchu (TW);
Yu-Hung Lin, Hsinchu (TW);
Shih-Hsiung Chien, Hsinchu (TW);
Chi-Heng Chung, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 556 days.

(21) Appl. No.: 17/853,945

(22) Filed: Jun. 30, 2022

(65) Prior Publication Data
US 2023/0077479 A1    Mar. 16, 2023

Related U.S. Application Data

(60) Provisional application No. 63/242,511, filed on Sep. 10, 2021.

(51) Int. Cl.
*H03F 3/21*    (2006.01)
*H03F 3/16*    (2006.01)
(Continued)

(52) U.S. Cl.
CPC ............ *H03F 3/21* (2013.01); *H03F 3/16* (2013.01); *H03F 3/301* (2013.01); *H03F 3/393* (2013.01);
(Continued)

(58) Field of Classification Search
CPC ... H03F 3/21; H03F 3/16; H03F 3/393; H03F 3/45632; H03F 2200/186; H03F 2200/432;
(Continued)

(56) References Cited

U.S. PATENT DOCUMENTS 6,317,000 B1   11/2001   Ivanov
6,380,808 B1    4/2002   Uasa
(Continued)

FOREIGN PATENT DOCUMENTS

CN        104734652 A        6/2015
CN        112019177 A   *   12/2020    ............ G05F 1/561

OTHER PUBLICATIONS

De Langen et al., Compact Low-Voltage Power-Efficient Operational Amplifier Cells for VLSI, 1998, IEEE Journal of Solid-State Circuits, vol. 33 (Year: 1998).*

(Continued)

*Primary Examiner* — Andrea Lindgren Baltzell
*Assistant Examiner* — Lance Torbjorn Bartol
(74) *Attorney, Agent, or Firm* — Winston Hsu

(57) ABSTRACT

The present invention provides an amplifier including an input stage, an amplifier stage, a power stage and a de-gain stage. The input stage is configured to receive an input signal to generate an amplified signal. The amplifier stage is configured to generate a first driving signal and a second driving signal according to the amplified signal. The power stage comprises a first input terminal and a second input terminal, wherein the power stage is coupled to a supply voltage and a ground voltage, for receiving the first driving signal and the second driving signal from the first input terminal and the second input terminal, respectively, and generating an output signal.

14 Claims, 7 Drawing Sheets

(51) Int. Cl.
  *H03F 3/30* (2006.01)
  *H03F 3/393* (2006.01)
  *H03F 3/45* (2006.01)

(52) U.S. Cl.
  CPC ... *H03F 3/45632* (2013.01); *H03F 2200/186* (2013.01); *H03F 2200/432* (2013.01); *H03F 2200/451* (2013.01); *H03F 2203/45281* (2013.01); *H03F 2203/45708* (2013.01)

(58) Field of Classification Search
  CPC .......... H03F 1/0205; H03F 3/45; H03F 3/301; H03F 2203/45281; H03F 2203/45708
  USPC ........................................................ 330/253
  See application file for complete search history.

(56) References Cited

U.S. PATENT DOCUMENTS

| | | | |
|---|---|---|---|
| 10,461,701 B2 * | 10/2019 | Wu | H03F 3/245 |
| 2008/0111626 A1 * | 5/2008 | Lin | H03F 3/45237 330/255 |
| 2020/0007099 A1 | 1/2020 | Ivanov | |

OTHER PUBLICATIONS

Klaas-Jan De Langen et al., Compact Low-Voltage Power-Efficient Operational Amplifier Cells for VLSI, IEEE Journal of Solid-State Circuits, Oct. 1998, pp. 1482-1496, vol. 33, No. 10, IEEE, XP000854248, Oct. 1998.

Ho , "An 87.1% Efficiency RF-PA Envelope-Tracking Modulator for 80MHz LTE-Advanced Transmitter and 31dBm PA Output Power for HPUE in 0.153um CMOS", 2018 IEEE International Solid-State Circuits Conference ,2018.

Mahmoudidaryan ,"A 91%-Efficiency Envelope-Tracking Modulator Using Hysteresis-Controlled Three-Level Switching Regulator and Slew-Rate-Enhanced Linear Amplifier for LTE-80MHz Applications", 2019 IEEE International Solid-State Circuits Conference ,2019.

Paek ,"An 88%-Efficiency Supply Modulator Achieving 1.08us/V Fast Transition and 100MHz Envelope-Tracking Bandwidth for 5G New Radio RF Power Amplifier", 2019 IEEE International Solid-State Circuits Conference ,2019.

* cited by examiner

HIGH-EFFICIENCY AMPLIFIER ARCHITECTURE WITH DE-GAIN STAGE

CROSS REFERENCE TO RELATED APPLICATIONS

This application claims the benefit of U.S. Provisional Application No. 63/242,511, filed on Sep. 10, 2021. The content of the application is incorporated herein by reference.

BACKGROUND

A conventional class-AB amplifier generally comprises an amplifying stage and a power stage, wherein the amplifier stage is configured to generate two driving signals to control a P-type metal-oxide-semiconductor (PMOS) and an N-type metal-oxide-semiconductor (NMOS) connected in series of the power stage. Ideally, the NMOS and the PMOS of the power stage are not enabled at the same time. However, in practice, when the NMOS is enabled to draw current, the PMOS will also be enabled due to the unavoidable capacitive coupling effect between the driving signals, resulting in the leakage current of the PMOS. In addition, the above phenomenon is more serious when the amplifier is operated at high frequency, and the class-AB amplifier may act like a class-A amplifier with lower efficiency.

SUMMARY

It is therefore an objective of the present invention to provide an amplifier with higher efficiency, to solve the above-mentioned problems.

According to one embodiment of the present invention, an amplifier comprising an input stage, an amplifier stage, a power stage and a de-gain stage is disclosed. The input stage is configured to receive an input signal to generate an amplified signal. The amplifier stage is configured to generate a first driving signal and a second driving signal according to the amplified signal. The power stage comprises a first input terminal and a second input terminal, wherein the power stage is coupled to a supply voltage and a ground voltage, for receiving the first driving signal and the second driving signal from the first input terminal and the second input terminal, respectively, and generating an output signal. The de-gain stage is configured to generate a first control signal to the first input terminal according to the second driving signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
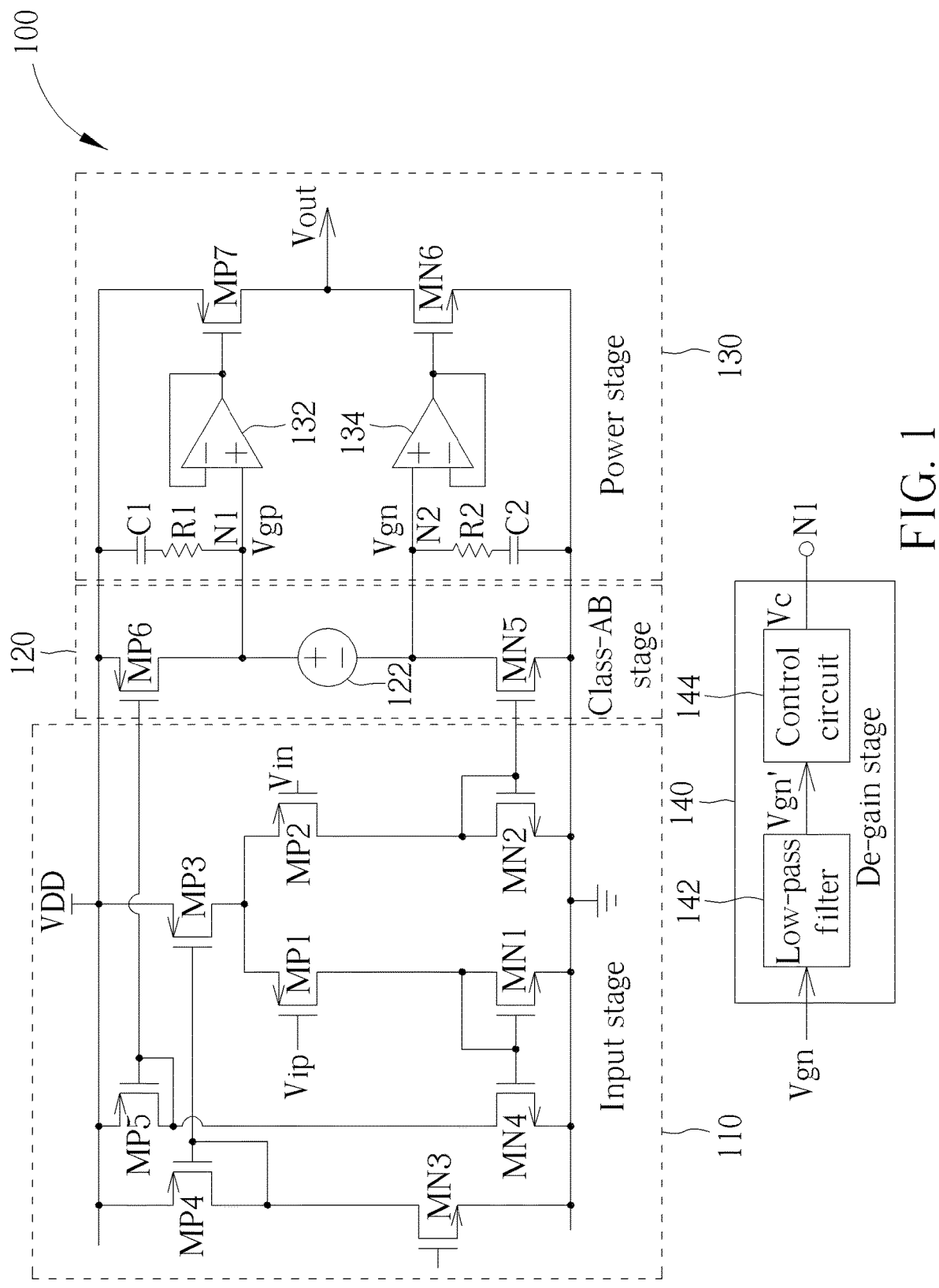
FIG. 1 is a diagram illustrating an amplifier according to one embodiment of the present invention.

FIG. 1 is a diagram illustrating an amplifier 100 according to one embodiment of the present invention, wherein the amplifier 100 is a class-AB amplifier. As shown in FIG. 1, the amplifier 100 comprises an input stage 110, an amplifier stage (in this embodiment, a class-AB stage 120 serves as the amplifier stage), a power stage 130 and a de-gain stage 140. The input stage 110 comprises a plurality of PMOSs MP1-MP5 and NMOSs MN1-MN4 coupled between a supply voltage VDD and a ground voltage, wherein the input stage 110 is configured to receive input signals Vip and Vin (differential input signal) to generate amplified signals to the class-AB stage 120. The class-AB stage 120 comprises a PMOS MP6, a floating voltage source 122 and an NMOS MN5 coupled between the supply voltage VDD and the ground voltage, wherein the PMOS MP6 and the NMOS MN5 are configured to receive the amplified signals provided by the input stage 110 to generate driving signals Vgp and Vgn. The power stage 130 comprises a first input terminal N1, a second input terminal N2, capacitors C1 and C2, resistors R1 and R2, two voltage buffers 132 and 134, a PMOS MP7 and an NMOS MN6, wherein the capacitor C1 and the resistor R1 are connected in series between the supply voltage VDD and the first input terminal N1, the capacitor C2 and the resistor R2 are connected in series between the second input terminal N2 and the ground voltage, the PMOS MP7 and the NMOS MN6 are connected in series between the supply voltage VDD and the ground voltage, and the PMOS MP7 and the NMOS MN6 are used to receive the driving signals Vgp and Vgn via the voltage buffers 132 and 134 to generate an output signal Vout. The de-gain stage 140 comprises a low-pass filter 142 and a control circuit 144, wherein the de-gain-stage 140 is configured to receive the driving signal Vgn from the second input terminal N2 to generate a control signal Vc to the first input terminal N1.

In one embodiment, the low-pass filter 142 may be a configurable low-pass filter, that is the 3-dB bandwidth of the low-pass filter 142 is configurable.

The circuit design of the power stage 130 is for illustrative only, not a limitation of the present invention. In other embodiments, the voltage buffers 132 and 134 may be removed from the power stage 130, or one or more transistors may be positioned between the supply voltage VDD and the PMOS MP7, or one or more transistors may be positioned between the PMOS MP7 and the output terminal of the power stage 130, or one or more transistors may be positioned between the NMOS MN6 and the ground voltage, or one or more transistors may be positioned between the NMOS MP6 and the output terminal of the power stage 130.

Because the operations of the input stage 110 and the class-AB stage 120 are known by a person skilled in the art, the following content mainly focuses on the power stage 130 and the de-gain stage 140.

In the operation of the power stage 130, ideally, the NMOS MN6 and the PMOS MP7 are not enabled at the same time, that is, the PMOS MP7 is enabled to source current from the supply voltage VDD to the output terminal while the NMOS MN6 is disabled, and the NMOS MN6 is enabled to sink current from the output terminal to the ground while the PMOS MP7 is disabled. Specifically, the class-AB stage 120 may generate the driving signals Vgp and Vgn to enable the PMOS MP7 and disable the NMOS MN6, to draw current from the supply voltage VDD to increase the voltage level of the output signal Vout; and the class-AB stage 120 may generate the driving signals Vgp and Vgn to disable the PMOS MP7 and enable the NMOS MN6, to sink current from the output terminal to decrease the voltage level of the output signal Vout. However, due to the unavoidable capacitive coupling effect between the driving signals Vgp and Vgn, both the PMOS MP7 and the NMOS MN6 will be enabled at the same time for a certain time interval, thus reducing the efficiency of the amplifier 100. For example, when the class-AB stage 120 switches the voltage level of the driving signal Vgn from high to low, that is the sinking current of the NMOS MN6 gradually decreased until the NMOS MN6 is completely disabled, the voltage level of the driving signal Vgp will decrease with the driving signal Vgn due to the capacitive coupling effect, so that the PMOS MP7 will draw current from the supply voltage VDD during "sinking current reduction" period.

In order to solve the above-mentioned problems, the amplifier 100 is designed to have the de-gain stage 140 to provide different path gain control for the P-side path (i.e., Vgp and MP7) and the N-side path (i.e., Vgn and MN6), to stabilize the driving signal Vgp when the voltage level of the driving signal Vgn is switched from high to low. Specifically, the low-pass filter 142 filters the driving signal Vgn to generate a filtered driving signal Vgn', and the control circuit 144 receives the filtered driving signal Vgn' to generate the control signal Vc to the first input terminal N1 to limit the swing of the driving signal Vgp. That is, by providing the control signal Vc to the first input terminal N1, the voltage level of the driving signal Vgp will not decrease too much with the driving signal Vgn due to the capacitive coupling effect.

Figure 2:
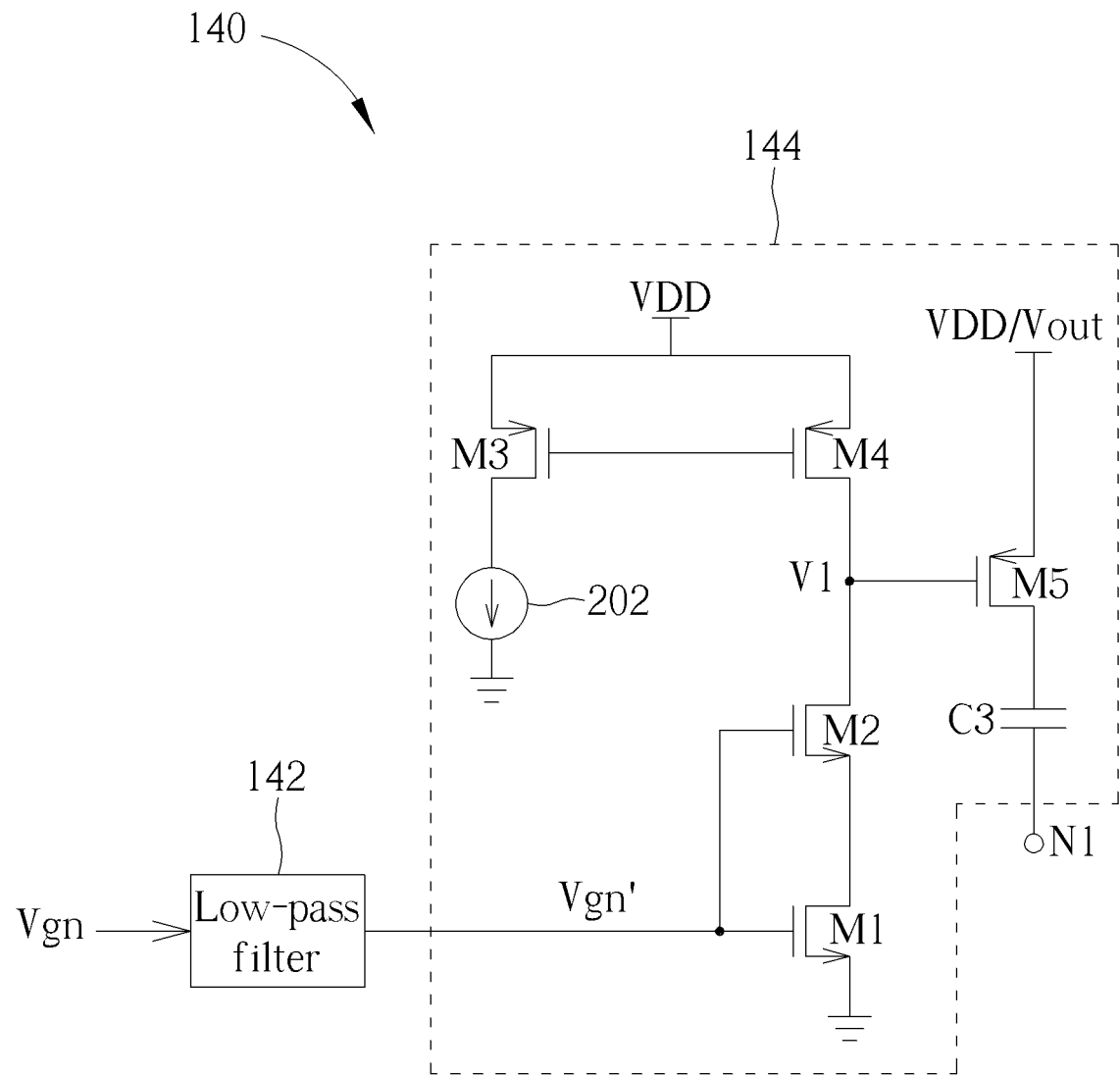
FIG. 2 is a diagram illustrating the de-gain stage according to one embodiment of the present invention.

FIG. 2 is a diagram illustrating the de-gain stage 140 according to one embodiment of the present invention. As shown in FIG. 2, the control circuit 144 comprises transistors M1-M5, a current source 202, and a capacitor C3, wherein the transistors M1 and M2 are NMOSs, the transistors M3-M5 are PMOSs, and the capacitor C3 has large capacitance such as 10 pF. The transistors M1-M4 serve as a current comparator to detect a large sinking current event (i.e., detect whether the driving signal Vgn has a high DC level, for example, if the filtered driving signal Vgn' is greater than a threshold level) to generate a first signal V1, and the first signal V1 is used to enable or disable the transistor M5. Specifically, when the driving signal Vgn has the high DC level, the filtered driving signal Vgn' will also have the high voltage level, and the transistors M1 and M2 are enabled so that the first signal V1 has a lower voltage level. At this time, the transistor M5 is enabled so that the first input terminal N1 is coupled to the supply voltage VDD or the output voltage Vout via the capacitor C3. Therefore, since the first input terminal N1 is coupled to the supply voltage VDD or the output voltage Vout via the capacitor C3 to reduce the path gain, the driving signal Vgp at the first input terminal N1 will not drop too much when the voltage level of the driving signal Vgn is from high to low due to the unavoidable capacitive coupling effect between Vgn and Vgp. In addition, when the driving signal Vgn has a lower DC level (i.e., the filtered driving signal Vgn' will also have the lower voltage level), the transistors M1 and M2 are disabled so that the first signal V1 has a higher voltage level to disable the transistor M5. At this time, the first input terminal N1 is not coupled to the supply voltage VDD or the output voltage Vout via the capacitor C3, and the path gain goes back to the original design.

It is noted that the circuit design shown in FIG. 2 is for illustrative only, not a limitation of the present invention. In other embodiments, as long as the control circuit 144 can couple the first input terminal N1 to the supply voltage VDD or the output voltage Vout via the capacitor C3 when the power stage 130 has large sinking current event, the control circuit 144 shown in FIG. 3 may have different circuit design.

Figure 3:
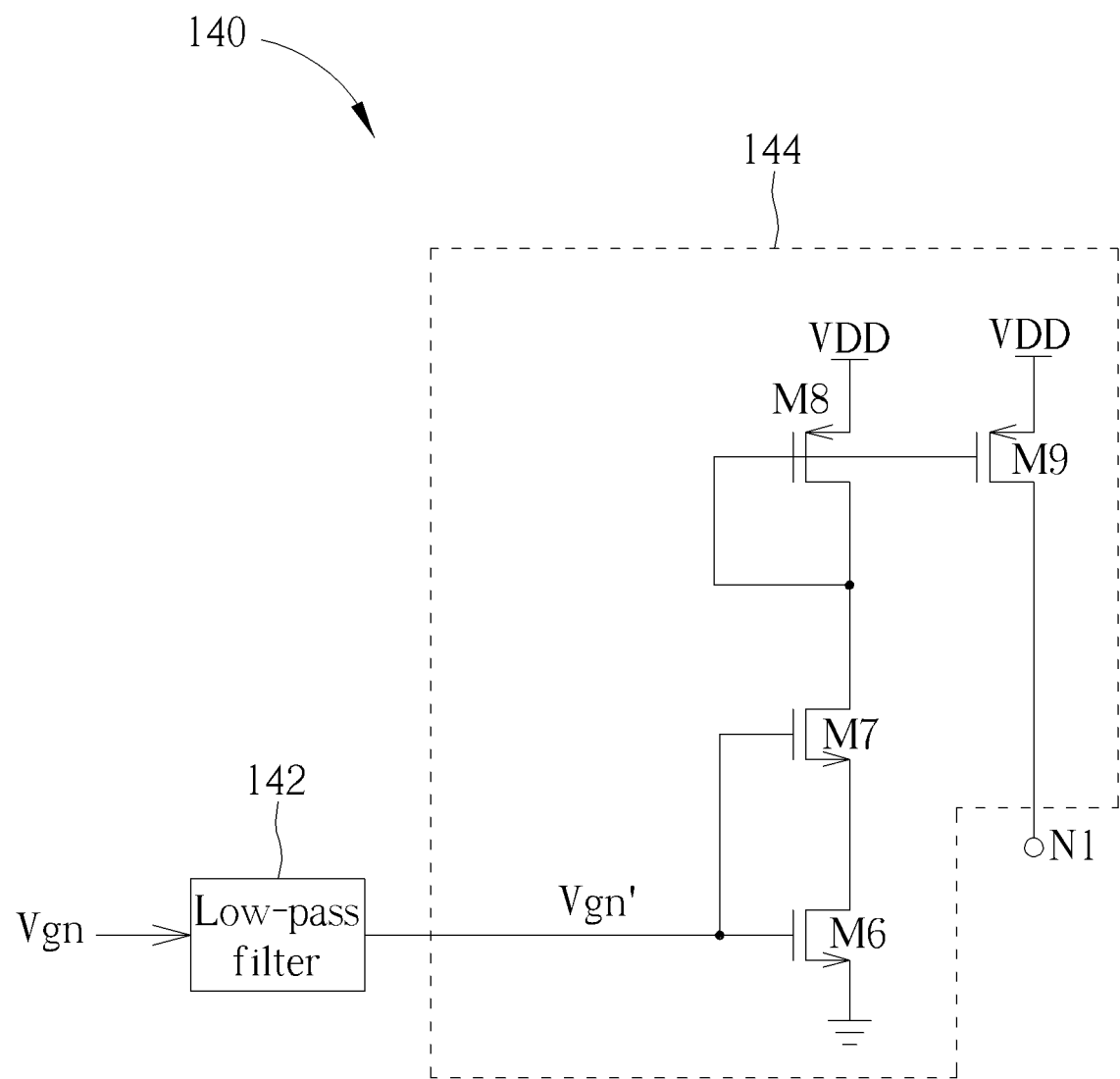
FIG. 3 is a diagram illustrating the de-gain stage according to one embodiment of the present invention.

FIG. 3 is a diagram illustrating the de-gain stage 140 according to another embodiment of the present invention. As shown in FIG. 3, the control circuit 144 comprises transistors M6-M9, wherein the transistors M6 and M7 are NMOSs, and the transistors M8 and M9 are PMOSs. In this embodiment, the transistors M6-M9 serve as a transconductance amplifier to detect a large sinking current event (i.e., detect whether the driving signal Vgn has a high DC level, for example, if the filtered driving signal Vgn' is greater than a threshold level) to determine if providing a current to the first input terminal N1. Specifically, when the driving signal Vgn has the high DC level, the filtered driving signal Vgn' will also have the high voltage level, and all of the transistors M6-M9 are enabled so that a large current is flowing from the supply voltage VDD to the first input terminal N1. Therefore, since the large current is flowing from the supply voltage VDD to the first input terminal N1, the voltage level of the driving signal Vgp at the first input terminal N1 will be close to the supply voltage VDD, and the driving signal Vgp at the first input terminal N1 will not drop to a level capable of enabling the PMOS MP7 when the voltage level of the driving signal Vgn is from high to low due to the unavoidable capacitive coupling effect. In addition, when the driving signal Vgn has a lower DC level (i.e., the filtered driving signal Vgn' will also have the lower voltage level), the transistors M6-M9 are disabled so that no current is flowing from the supply voltage VDD to the first input terminal N1 via the transistor M9. At this time, the first input terminal N1 is not coupled to the supply voltage VDD via the transistor M9, and the path gain goes back to the original design.

It is noted that the circuit design shown in FIG. 3 is for illustrative only, not a limitation of the present invention. In other embodiments, as long as the control circuit 144 can provide a current to the first input terminal N1 to increase the voltage level of the driving signal Vgp when the power stage 130 has large sinking current event, the control circuit 144 shown in FIG. 3 may have different circuit design.

Figure 4:
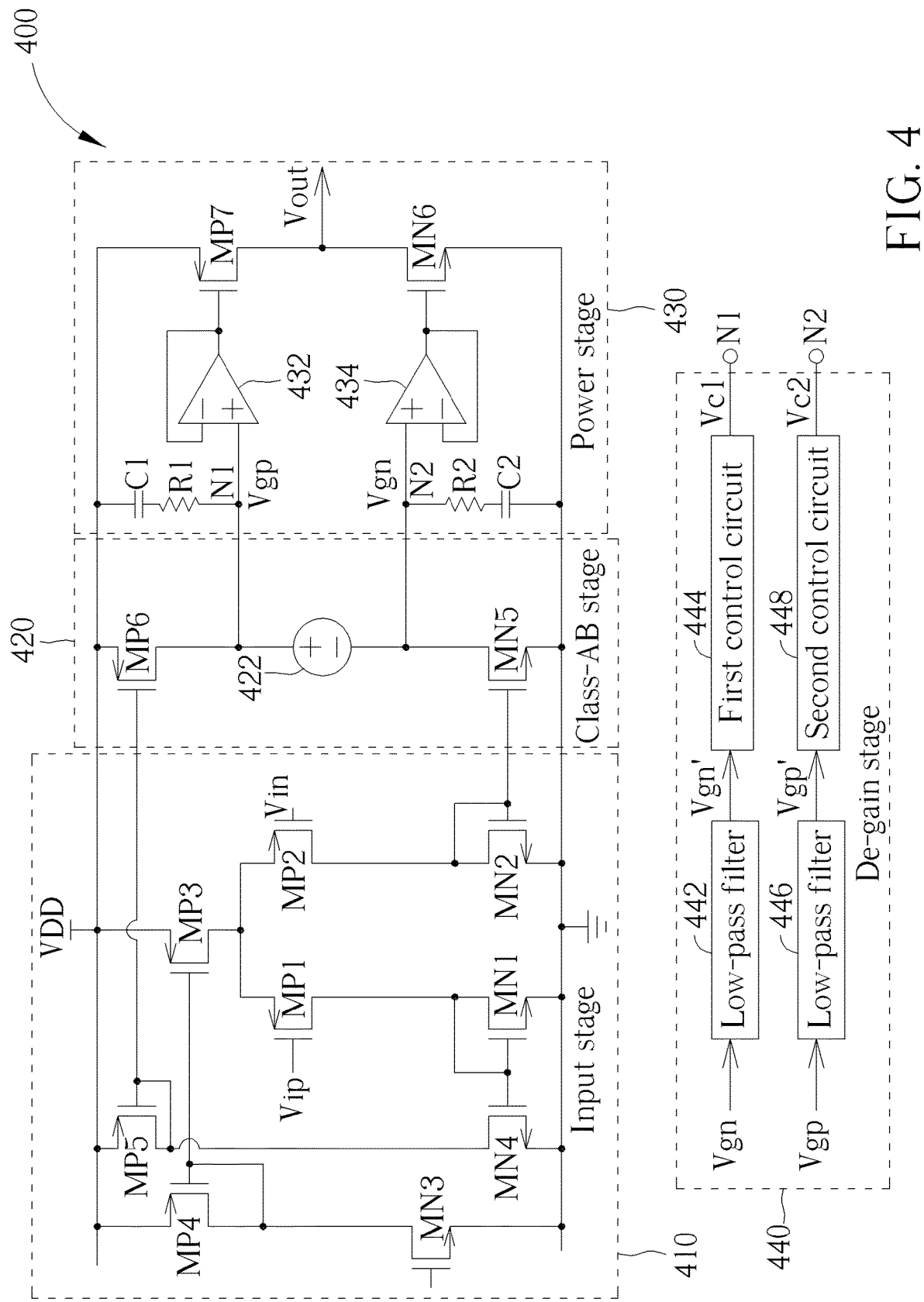
FIG. 4 is a diagram illustrating an amplifier according to one embodiment of the present invention.

FIG. 4 is a diagram illustrating an amplifier 400 according to one embodiment of the present invention, wherein the amplifier 400 is a class-AB amplifier. As shown in FIG. 4, the amplifier 400 comprises an input stage 410, an amplifier stage (in this embodiment, a class-AB stage 420 serves as the amplifier stage), a power stage 430 and a de-gain stage 440. The input stage 410 comprises a plurality of PMOSs MP1-MP5 and NMOSs MN1-MN4 coupled between a supply voltage VDD and a ground voltage, wherein the input stage 410 is configured to receive input signals Vip and Vin (differential input signal) to generate amplified signals to the class-AB stage 420. The class-AB stage 420 comprises a PMOS MP6, a floating voltage source 422 and an NMOS MN5 coupled between the supply voltage VDD the ground voltage, wherein the PMOS MP6 and the NMOS MN5 are configured to receive the amplified signals provided by the input stage 410 to generate driving signals Vgp and Vgn. The power stage 430 comprises a first input terminal N1, a second input terminal N2, capacitors C1 and C2, resistors R1 and R2, two voltage buffers 432 and 434, a PMOS MP7 and an NMOS MN6, wherein the capacitor C1 and the resistor R1 are connected in series between the supply voltage VDD and the first input terminal N1, the capacitor C2 and the resistor R2 are connected in series between the second input terminal N2 and the ground voltage, the PMOS MP7 and the NMOS MN6 are connected in series between the supply voltage VDD and the ground voltage, and the PMOS MP7 and the NMOS MN6 are used to receive the driving signals Vgp and Vgn via the voltage buffers 432 and 434 to generate an output signal Vout. The de-gain stage 440 comprises a low-pass filter 442, a first control circuit 444, a low-pass filter 446 and a second control circuit 448, wherein the de-gain-stage 440 is configured to receive the driving signal Vgn from the second input terminal N2 to generate a first control signal Vc1 to the first input terminal N1, and receive the driving signal Vgp from the first input terminal N1 to generate a second control signal Vc2 to the second input terminal N2.

In one embodiment, the low-pass filter 442 and the low-ass filter 446 may be configurable low-pass filters, that is the 3-dB bandwidth of each of the low-pass filter 442/446 is configurable.

The circuit design of the power stage 430 is for illustrative only, not a limitation of the present invention. In other embodiments, the voltage buffers 432 and 434 may be removed from the power stage 430, or one or more transistors may be positioned between the supply voltage VDD and the PMOS MP7, or one or more transistors may be positioned between the PMOS MP7 and the output terminal of the power stage 430, or one or more transistors may be positioned between the NMOS MN6 and the ground voltage, or one or more transistors may be positioned between the NMOS MP6 and the output terminal of the power stage 430.

Because the operations of the input stage 410 and the class-AB stage 420 are known by a person skilled in the art, the following content mainly focuses on the power stage 430 and the de-gain stage 440.

In the operation of the power stage 430, ideally, the NMOS MN6 and the PMOS MP7 are not enabled at the same time, that is, the PMOS MP7 is enabled to source current from the supply voltage VDD to the output terminal while the NMOS MN6 is disabled, and the NMOS MN6 is enabled to sink current from the output terminal to the ground while the PMOS MP7 is disabled. Specifically, the class-AB stage 420 may generate the driving signals Vgp and Vgn to enable the PMOS MP7 and disable the NMOS MN6, to draw current from the supply voltage VDD to increase the voltage level of the output signal Vout; and the class-AB stage 420 may generate the driving signals Vgp and Vgn to disable the PMOS MP7 and enable the NMOS MN6, to sink current from the output terminal to decrease the voltage level of the output signal Vout. However, due to the unavoidable capacitive coupling effect between the driving signals Vgp and Vgn, both the PMOS MP7 and the NMOS MN6 will be enabled at the same time for a certain time interval, thus reducing the efficiency of the amplifier 400. For example, when the class-AB stage 420 switches the voltage level of the driving signal Vgn from high to low, that is the sinking current of the NMOS MN6 gradually decreased until the NMOS MN6 is completely disabled, the voltage level of the driving signal Vgp will decrease with the driving signal Vgn due to the capacitive coupling effect, so that the PMOS MP7 will draw current from the supply voltage VDD during "sinking current reduction" period. Similarly, when the class-AB stage 420 switches the voltage level of the driving signal Vgp from low to high, that is the sourcing current of the PMOS MP7 gradually decreased until the PMOS MP7 is completely disabled, the voltage level of the driving signal Vgn will increase with the driving signal Vgp due to the capacitive coupling effect, so that the NMOS MN6 will sink current from the output terminal of the power stage 430 to the ground during "sourcing current reduction" period.

In order to solve the above-mentioned problems, the amplifier 400 is designed to have the de-gain stage 440 to provide different path gain control for the P-side path (i.e., Vgp and MP7) and the N-side path (i.e., Vgn and MN6), to stabilize the driving signal Vgp when the voltage level of the driving signal Vgn is switched from high to low, and to stabilize the driving signal Vgn when the voltage level of the driving signal Vgp is switched from low to high. Specifically, the low-pass filter 442 filters the driving signal Vgn to generate a filtered driving signal Vgn', and the first control circuit 444 receives the filtered driving signal Vgn' to generate the first control signal Vc1 to the first input terminal N1 to limit the swing of the driving signal Vgp. That is, by providing the first control signal Vc1 to the first input terminal N1, the voltage level of the driving signal Vgp will not decrease too much with the driving signal Vgn due to the capacitive coupling effect between Vgp and Vgn. Similarly, the low-pass filter 446 filters the driving signal Vgp to generate a filtered driving signal Vgp', and the second control circuit 448 receives the filtered driving signal Vgp' to generate the second control signal Vc2 to the second input terminal N2 to limit the swing of the driving signal Vgn. That is, by providing the second control signal Vc2 to the second input terminal N2, the voltage level of the driving signal Vgn will not decrease too much with the driving signal Vgp due to the capacitive coupling effect between Vgp and Vgn.

The operations of the low-pass filter 442 and the first control circuit 444 are similar to the operations of the low-pass filter 142 and the control circuit 144 shown in FIG. 1, and first control circuit 444 can be implemented by the embodiment shown in FIG. 2 and FIG. 3. That is, the first control circuit 444 can couple the first input terminal N1 to the supply voltage VDD or the output voltage Vout via the capacitor C3 when the power stage 430 has large sinking current event (for example, the filtered driving signal Vgn' is greater than a threshold level), and the first input terminal N1 is not coupled to the supply voltage VDD or the output voltage Vout via the capacitor C3 when the power stage 430 does not have large sinking current event; or the first control circuit 444 can provide a current to the first input terminal N1 to increase the voltage level of the driving signal Vgp when the power stage 430 has large sinking current event, and the first control circuit 444 does not provide the current to the first input terminal N1 when the power stage 430 does not have large sinking current event.

Similar to the operation of the first control circuit 444, the second control circuit 448 can couple the second input terminal N2 to the ground voltage or the output voltage Vout via a capacitor when the power stage 430 has large sourcing current event (i.e., the driving signal Vgp and the filtered driving signal Vgp' have lower DC level, for example, the filtered driving signal Vgp' is lower than a threshold level), and the second input terminal N2 is not coupled to the ground voltage or the output voltage Vout via the capacitor when the power stage 430 does not have large sourcing current event; or the second control circuit 448 can sink current from the second input terminal N2 to decrease the voltage level of the driving signal Vgn when the power stage 430 has large sourcing current event, and the second control circuit 448 does not sink the current from the second input terminal N2 when the power stage 430 does not have large sourcing current event.

Figure 5:
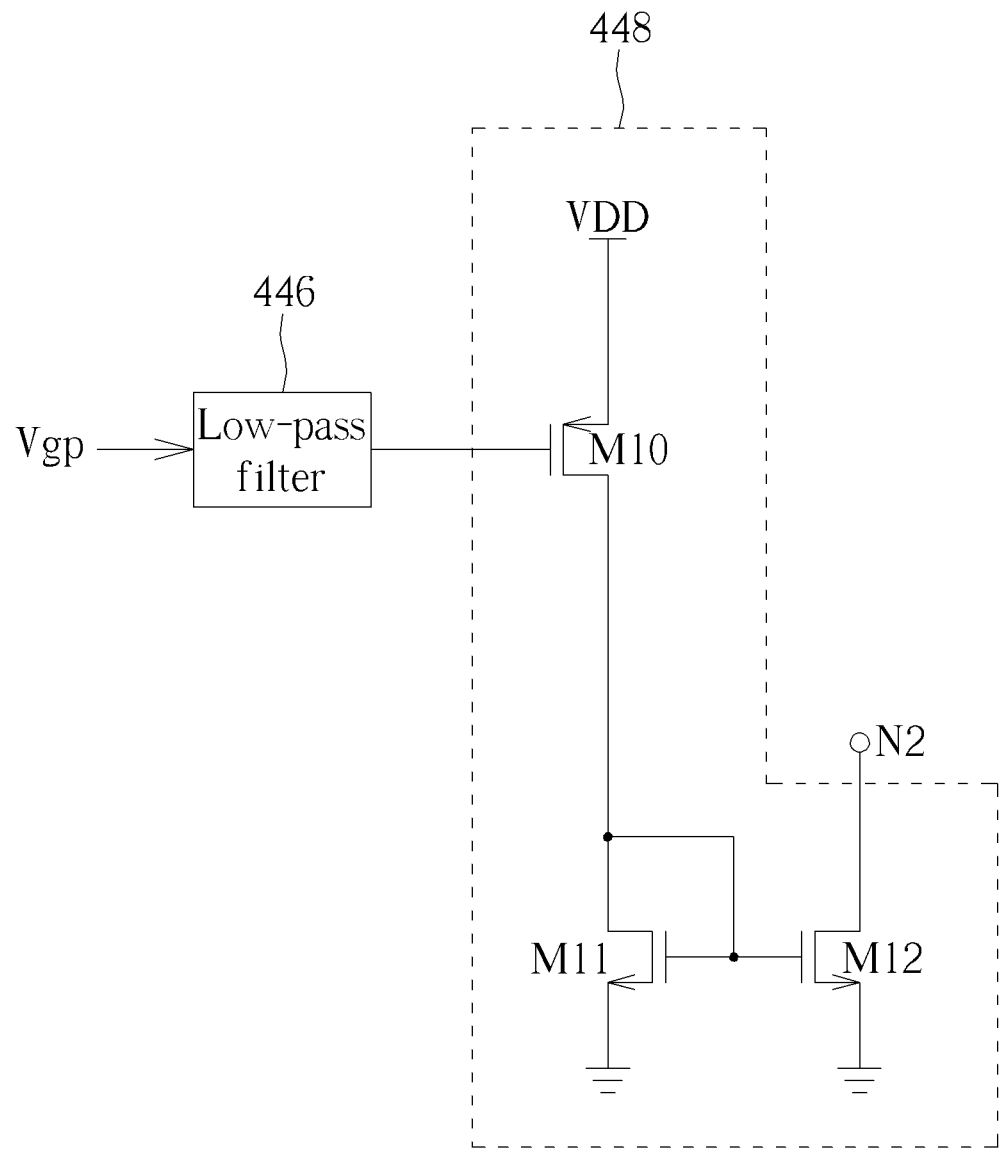
FIG. 5 is a diagram illustrating the low-pass filter and the second control circuit shown in FIG. 4 according to another embodiment of the present invention.

FIG. 5 is a diagram illustrating the low-pass filter 446 and the second control circuit 448 according to another embodiment of the present invention. As shown in FIG. 5, the second control circuit 448 comprises transistors M10-M12, wherein the transistor M10 is a PNMOS, and the transistors M11 and M12 are NMOSs. In this embodiment, the transistors M10-M12 serve as a transconductance amplifier to detect a large sourcing current event (i.e., detect whether the driving signal Vgp has a lower DC level) to determine if providing a current to the second input terminal N2. Specifically, when the driving signal Vgp has the low DC level, the filtered driving signal Vgp' will also have the low voltage level, and all of the transistors M10-M12 are enabled so that a large current is drawing from the second input terminal N2 to the ground voltage. Therefore, since the large current is drawing from the second input terminal N2 to the ground voltage, the voltage level of the driving signal Vgn at the second input terminal N2 will be close to the ground voltage, and the driving signal Vgn at the second input terminal N2 will not raise to a level capable of enabling the NMOS MN6 when the voltage level of the driving signal Vgp is from low to high due to the unavoidable capacitive coupling effect. In addition, when the driving signal Vgp has a higher DC level (i.e., the filtered driving signal Vgp' will also have the higher voltage level), the transistors M10-M12 are disabled so that no current is drawing from the second input terminal N2 to the ground voltage via the transistor M12. At this time, the second input terminal N2 is not coupled to the ground voltage via the transistor M12, and the path gain goes back to the original design.

It is noted that the circuit design shown in FIG. 5 is for illustrative only, not a limitation of the present invention. In other embodiments, as long as the second control circuit 448 can provide a current to the second input terminal N2 to decrease the voltage level of the driving signal Vgn when the power stage 430 has large sourcing current event, the second control circuit 448 may have different circuit design.

Figure 6:
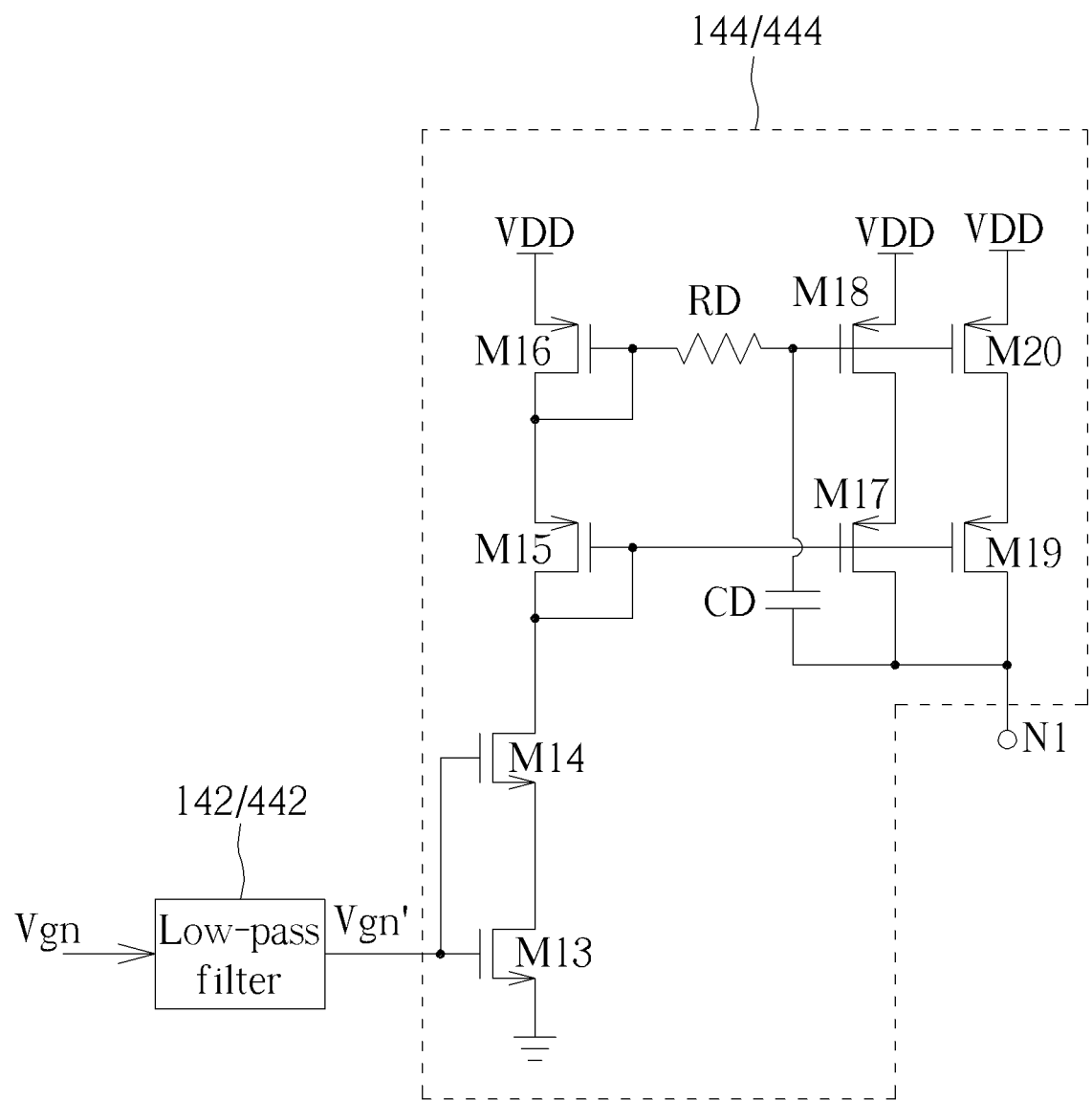
FIG. 6 is a diagram illustrating the control circuit according to one embodiment of the present invention.

In the embodiments shown in FIG. 3 and FIG. 5, the driving signal Vgp and the driving signal Vgn are stabilized by using transconductance amplifiers to provide large current in appropriate times, however, injecting a large current may cause a DC shift issue. To solve this problem, the embodiment shown in FIG. 3 and FIG. 5 may be modified to add a damping circuit to make the current provided by the transconductance amplifier smoother. FIG. 6 is a diagram illustrating the control circuit 144 or the first control circuit 444 according to another embodiment of the present invention. As shown in FIG. 6, the control circuit 144 comprises transistors M13-M20, a damping circuit comprising transistors M17-M20, a resistor RD and a capacitor CD, wherein the transistors M13 and M14 are NMOSs, and the transistors M15-M20 are PMOSs. In this embodiment, the transistors M13-M20 serve as a transconductance amplifier to detect a large sinking current event to determine if providing a current to the first input terminal N1, and the damping circuit is coupled between the first input terminal N1 and the internal terminal or input terminal of the transconductance amplifier. Specifically, when the driving signal Vgn has the high DC level, the filtered driving signal Vgn' will also have the high voltage level, and all of the transistors M13-M20 are enabled so that a large current is flowing from the supply voltage VDD to the first input terminal N1. At the meanwhile, due to the damping circuit, the transconductance amplifier could produce a large and stable output impedance at the output terminal, and the DC-shifting issue (i.e., the DC level is shifted from one value to the other one) will not occur at the first input terminal N1.

Figure 7:
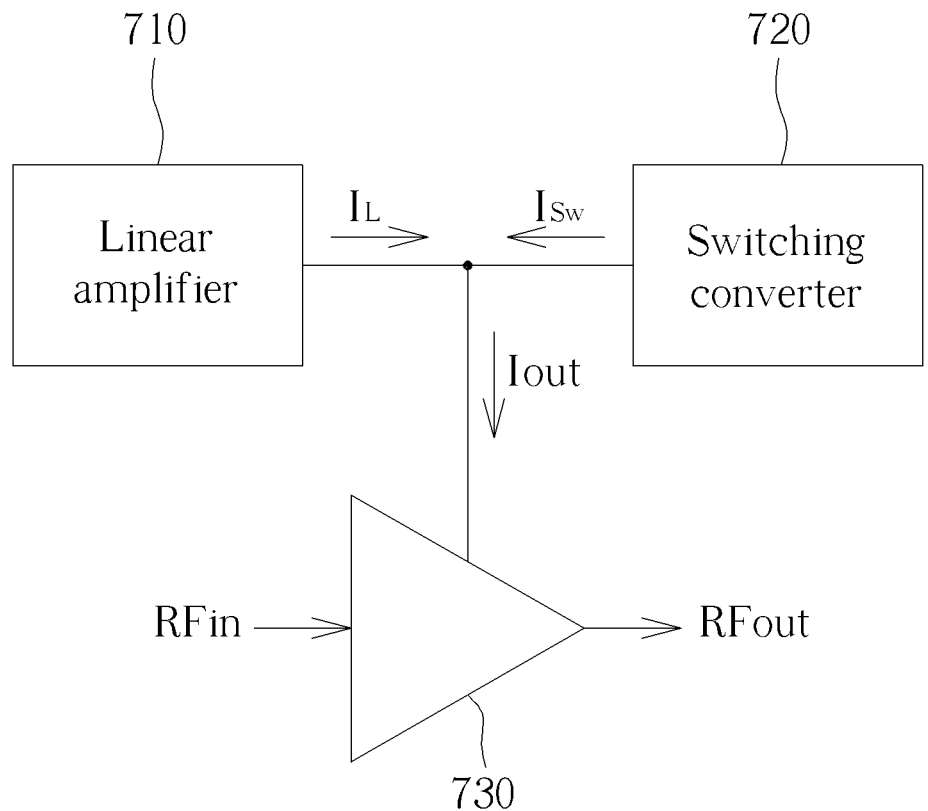
FIG. 7 is a diagram illustrating a supply modulator and a power amplifier according to one embodiment of the present invention

In one embodiment, the amplifier 100/400 can be used as a linear amplifier within a supply modulator or an envelope tracking modulator. FIG. 7 is a diagram illustrating a supply modulator and a power amplifier 730 according to one embodiment of the present invention, wherein the supply modulator comprises a linear amplifier 710 and a switching converter 720. As shown in FIG. 7, the power amplifier 730 is configured to receive a radio frequency input signal RFin to generate a radio frequency output signal RFout, and a supply voltage of the power amplifier 730 is generated by the linear amplifier 710 and the switching converter 720. Specifically, the switching converter 720 is configured to provide low-frequency current $I_{sw}$ with high efficiency, and the linear amplifier 710 is configured to provide high-frequency current IL with middle efficiency, and a summation of the current ISW and the current IL form an output current Iout flowing into the power amplifier 730.

Briefly summarized, in the amplifier of the present invention, by designing a de-gain stage in the amplifier to limit the swing the driving signal Vgp when the power stage has a large sinking current event, and/or limit the swing the driving signal Vgn when the power stage has a large sourcing current event, the problem that both the PMOS and NMOS of the power stage are enabled at certain periods due to the capacitive coupling effect can be avoided, and the efficiency of the amplifier is improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. An amplifier, comprising:
an input stage, configured to receive an input signal to generate an amplified signal;
an amplifier stage, coupled to the input stage, configured to generate a first driving signal and a second driving signal according to the amplified signal;
a power stage comprising a first input terminal and a second input terminal, wherein the power stage is coupled to a supply voltage and a ground voltage, for receiving the first driving signal and the second driving signal from the first input terminal and the second input terminal, respectively, and generating an output signal; and a de-gain stage, coupled to the power stage, configured to generate a first control signal to the first input terminal according to the second driving signal;

wherein the de-gain stage comprises:

a first low-pass filter, configured to filter the second driving signal to generate a filtered second driving signal; and a first control circuit, coupled to the first low-pass filter, configured to generate the first control signal to the first input terminal of the power stage to limit a swing of the first driving signal according to the filtered second driving signal.

2. The amplifier of claim 1, wherein the amplifier stage is a class-AB stage.

3. The amplifier of claim 1, wherein in response to the filtered second driving signal being greater than a threshold level, the first control circuit couples the first input terminal of the power stage to the supply voltage or the output signal via a capacitor.

4. The amplifier of claim 3, wherein in response to the filtered second driving signal not being greater than the threshold level, the first control circuit does not couple the first input terminal of the power stage to the supply voltage or the output signal via the capacitor.

5. The amplifier of claim 1, wherein in response to the filtered second driving signal being greater than a threshold level, the first control circuit uses a transconductance amplifier to provide a current to the first input terminal of the power stage.

6. The amplifier of claim 5, wherein in response to the filtered second driving signal not being greater than the threshold level, the first control circuit does not provide the current to the first input terminal of the power stage.

7. The amplifier of claim 5, wherein the first control circuit comprises a damping circuit coupled between the first input terminal of the power stage and an internal terminal or an input terminal of the transconductance amplifier.

8. The amplifier of claim 1, wherein the power stage further comprises a P-type transistor and an N-type transistor; and the P-type transistor is coupled between the supply voltage and an output terminal, the N-type transistor is coupled between the output terminal and the ground voltage, the P-type transistor receives the first driving signal from the first input terminal, and the N-type transistor receives the second driving signal from the second input terminal, to generate the output signal.

9. The amplifier of claim 8, wherein the de-gain stage further comprises:

a second low-pass filter, configured to filter the first driving signal to generate a filtered first driving signal; and a second control circuit, coupled to the second low-pass filter, configured to generate a second control signal to the second input terminal of the power stage to limit a swing of the second driving signal according to filtered first driving signal.

10. The amplifier of claim 9, wherein in response to the filtered first driving signal being less than a threshold level, the second control circuit couples the second input terminal of the power stage to the ground voltage or the output signal via a capacitor.

11. The amplifier of claim 10, wherein in response to the filtered first driving signal being not less than the threshold level, the second control circuit does not couple the second input terminal of the power stage to the ground voltage or the output signal via the capacitor.

12. The amplifier of claim 9, wherein in response to the filtered first driving signal being less than a threshold level, the second control circuit uses a transconductance amplifier to provide a current to the second input terminal of the power stage.

13. The amplifier of claim 12, wherein in response to the filtered first driving signal being not less than the threshold level, the second control circuit does not provide the current to the second input terminal of the power stage.

14. The amplifier of claim 1, wherein the amplifier is a linear amplifier used in a supply modulator.

* * * * *